(12) United States Patent
Cathelin et al.

(10) Patent No.: US 7,683,742 B2
(45) Date of Patent: Mar. 23, 2010

(54) INTEGRATED ELECTRONIC CIRCUITRY COMPRISING TUNABLE RESONATOR

(75) Inventors: Andreia Cathelin, Laval (FR); Stephane Razafimandimby, Grenoble (FR); Cyrille Tilhac, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 209 days.

(21) Appl. No.: 11/840,137

(22) Filed: Aug. 16, 2007

(65) Prior Publication Data

US 2008/0088393 A1 Apr. 17, 2008

(30) Foreign Application Priority Data

Aug. 17, 2006 (FR) .................................. 06 07346

(51) Int. Cl.
*H03H 9/02* (2006.01)
*H03H 11/00* (2006.01)
*H03B 5/36* (2006.01)

(52) U.S. Cl. ....................................... 333/188; 333/213

(58) Field of Classification Search ................ 333/133, 333/187, 188, 189, 190, 191, 192, 193, 194, 333/195, 196, 213; 331/107 A, 116 R, 117 R
See application file for complete search history.

(56) References Cited

U.S. PATENT DOCUMENTS

| 4,575,690 | A | * | 3/1986 | Walls et al. ................... 331/162 |
| 5,043,681 | A | * | 8/1991 | Tanemura et al. ........ 331/107 A |
| 5,717,363 | A | * | 2/1998 | Imai et al. ................ 331/107 A |
| 5,777,522 | A | * | 7/1998 | Rybicki et al. ............. 331/36 R |
| 6,239,664 | B1 | * | 5/2001 | Northam .................. 331/108 R |
| 6,696,899 | B2 | * | 2/2004 | Ruffieux ...................... 331/154 |
| 6,798,304 | B2 | * | 9/2004 | Gomez ................. 331/116 FE |
| 7,065,331 | B2 | | 6/2006 | Korden et al. ............. 455/150.1 |
| 7,135,940 | B2 | * | 11/2006 | Kawakubo et al. ......... 333/17.1 |
| 7,274,274 | B2 | | 9/2007 | Carpentier et al. |
| 7,345,554 | B2 | * | 3/2008 | Cathelin et al. ............. 331/154 |
| 2008/0088390 | A1 | | 4/2008 | Cathelin et al. ............. 333/188 |

FOREIGN PATENT DOCUMENTS

| DE | 4306512 | 9/1994 |
| EP | 1265352 | 12/2002 |
| FR | 2864729 | 7/2005 |
| FR | 2864733 | 7/2005 |
| JP | 10-256830 | 9/1998 |

OTHER PUBLICATIONS

Thanachayanont, A., et al., "Class AB VHF CMOS Active Inducer," The 2002 45th Midwest Symposium on Circuits and Systems, Conference Proceeding, Tulsa, OK, Aug. 4-7, 2002, IEEE, vol. 1 of 3, pp. 64-67.

(Continued)

*Primary Examiner*—Dean O Takaoka
(74) *Attorney, Agent, or Firm*—Lisa K. Jorgenson; E. Russell Tarleton; Seed IP Law Group PLLC

(57) ABSTRACT

An electronic circuit includes: an acoustic resonator of BAW or SAW type, said resonator having a series resonance frequency and a parallel resonance frequency; an active circuit which is coupled in parallel to said acoustic resonator, said active circuit having a negative capacity acting on the parallel resonance frequency of said resonator.

27 Claims, 23 Drawing Sheets

OTHER PUBLICATIONS

Drew, J. et al., "Generation of Negative Capacitance in a Common Gate MESFET Stage and Application to Optical Receiver Design at Microwave Frequencies," Wideband Circuits, Modeling and Techniques, The Institution of Electrical Engineers, May 1996, pp. 2/1-2/5.

Kolev, S. et al., "Using a Negative Capacitance to Increase the Tuning Range of a Varactor Diode in MMIC Technology," IEEE Transactions on Microwave Theory and Techniques, Dec. 2001, pp. 2425-2430.

Thanachayanont, A., et al., "Class AB VHF CMOS Active Inductor," The 2002 $45^{th}$ Midwest Symposium on Circuits and Systems, Conference Proceedings, Tulsa, OK, Aug. 4-7, 2002, IEEE, pp. 64-67.

* cited by examiner

Series resonance frequency $\quad \omega_s = \sqrt{\dfrac{1}{Lm \times Cm}}$

Parallel resonance frequency $\quad \omega_p = \sqrt{\dfrac{1}{Lm \times Cm}} \times \sqrt{\dfrac{Cm + C0}{C0}}$

FIG. 1C

$$i = g_m(-V1-Va) \quad (1)$$

$$i = jC\omega(Va-(-Va)) = 2jC\omega Va \quad (2)$$

$$(2) \text{ dans } (1) \Rightarrow i\left(1 + \frac{g_m}{j2C\omega}\right) = -g_m V1$$

$$\frac{V1}{i} = -\frac{1}{g_m} - \frac{1}{j2C\omega}$$

$$Z = \frac{(V1 - V2)}{i} = -\frac{2}{g_m} - \frac{1}{jC\omega}$$

FIG. 9

INTEGRATED ELECTRONIC CIRCUITRY COMPRISING TUNABLE RESONATOR

TECHNICAL FIELD

The present disclosure generally relates to microelectronic circuits and more particularly but not exclusively to an integrated electronic circuitry comprising a tunable resonator.

BACKGROUND INFORMATION

Acoustic resonators are components which were subject of numerous technical studies. Conventionally, one distinguishes between Surface Acoustic Resonator (SAW) and Bulk Acoustic Resonator (BAW). In SAWs, the acoustic resonator is located on the surface of a semiconductor product while, in BAWs, it lays inside a volume delimited between a lower electrode and a higher electrode so that the acoustic wave develops in this volume.

Because of their efficiency, acoustic resonators are frequently used in radio frequency (RF) filtering and in particular in mobile telephony. They are however likely to serve in many other applications but the clear obstacle to their general use reside in the difficulty to be integrated with other electronics circuitry in a same semiconductor product.

Indeed, the components which are produced in the manufacturing lines show a great dispersion in their characteristics, and this even for the BAW type resonator which show to be more suitable for a direct integration on a silicium substrate.

Conventionally, one solves the problem of the dispersion in the characteristics of the components by selectively sorting the manufactured components in order to keep the particular one which fully complies with specifications.

One may also try to solve the problem of dispersion of the characteristics by integrating those resonators within a tunable structure. This permits on one hand, to compensate for the shortfalls of the manufacturing process and, on the other hand, to take advantage of new functions which result from the tuning possibilities given to the resonator.

U.S. Patent Application Publication No. 2004/0033794 entitled "RESONATOR CONFIGURATION", published on Feb. 19, 2004 discloses a process for tuning a resonator located on an integrated circuit by means of a second resonator of reference which is also located on the same substrate. The reference resonator is used in a VCO type circuit (Voltage Control Oscillator) for the purpose of generating local oscillation.

U.S. patent application Ser. No. 11/025,599 entitled "INTEGRABLE ACOUSTIC RESONATOR AND METHOD FOR INTEGRATING SUCH RESONATOR", filed on Dec. 29, 2004, discloses a new acoustic component which is easy to integrate on a silicium substrate. Indeed, one uses an acoustic resonator which is based on a dielectric mirror located on a silicium substrate. To this end, an acoustic resonator based on a dielectric medium arranged on a reflecting element, such as a Bragg mirror or a receiver for example, is used. Layers having different acoustic properties and different dielectric constants are stacked on a silicon substrate. Such an acoustic element is known as a Surface Mounted Resonator (SMR).

Alternatively, the resonator could be of the Film Bulk Acoustic Resonator type (FBAR), namely a resonator located above a cavity to allow the reflection of acoustic waves and to avoid damping thereof.

FIGS. 1A, 1B and 1C respectively illustrate the electrical model of a BAW type resonator (showing two L-C type resonating circuits, respectively series and parallel, comprising elements Lm, Cm and C0 with resistors Raccess, Rm and Ro), the characteristic curve of the impedance as well as the formulas giving the computation of the series resonance frequency and parallel resonance frequency of that component. As this can be seen, the impedance curve shows a resonance frequency Fs (series resonance frequency) and an anti-resonance frequency Fp (or parallel resonance frequency) which are very close to each other.

Generally speaking, the difference between the anti-resonance frequency and the resonance frequency in a filtering circuit defines the pass band of that circuit and the tuning of the filter based on such resonators shows to be difficult to achieve. One solves this problem by using a Tunable Resonator Component (TRC) described in the above mentioned U.S. patent document. As this is seen in FIG. 2A, one connects in parallel an inductor to the resonator. This inductor has a first technical effect of shifting to the right the useful anti-resonance frequency so as to move it away from the series resonance frequency. This achieves a filtering circuit which can be tuned in frequency. The inductor moreover results in the generation of a second anti-resonance frequency, which is located at the left of the series resonance frequency as this can be seen in FIG. 2B. This second anti-resonance frequency is a parasitic effect which one tries to keep outside of the useful band, particularly by locating the resonance frequency at the middle of the range of frequencies defined by the two anti-resonance frequencies.

In order to complete the arrangement of the Tunable Resonator Component (TRC) known in the art, one introduces in series a variable capacitive element, such as a varactor. This varactor allows the tuning of the series resonance frequency and, finally, the adjustment of the frequency of the TRC.

That circuit operates in a satisfactory manner but with some drawbacks.

Firstly, that circuit requires, for every BAW resonator, one inductor—e.g., an integrated spiral inductor - which is known to occupy a non negligible surface on the semi-conductor substrate. When a complex band pass filter has to be carried out, based on a set of components illustrated in FIG. 2A, it becomes necessary to allocate an expensive surface of silicium.

Secondly, integrated inductors on silicium substrate have a low quality factor resulting in additional losses and jeopardizing the performance of the BAW resonators. Inductors with higher quality factors do exists but they required a different substrate, such as a glass substrate, and this is a clear obstacle for the purpose of achieving a low costs manufacturing process.

BRIEF SUMMARY

An embodiment of the present invention provides an alternative arrangement of Tunable Resonator Component which does not require any integrated inductor.

An embodiment provides a circuit comprising a tunable integrated resonator, of the SAW or BAW type, which is easy to integrate in a semiconductor substrate and which provides a wide number of functions and possibilities.

Another embodiment provides a tunable resonator circuit, based on a BAW or a SAW type resonator, which does not require any tuning inductor and does not jeopardize the quality factor of the resonator and which further does not generate any parasitic anti-resonant frequency.

An embodiment of an electronic circuit comprises:
  an acoustic resonator of BAW or SAW type, said resonator having a series resonant frequency and a parallel resonant frequency;

an active circuit which is coupled in parallel to said acoustic resonator, said active circuit embodying a negative capacity acting on the parallel resonant frequency of said resonator.

In one embodiment, the circuit comprises, in series with the resonator and the active circuit, an adjustable capacitive element for controlling the series resonant frequency.

In one embodiment, the adjustable capacitive element is a varactor being controlled by a control voltage.

In one particular embodiment, the active circuit comprises a first input and a second input and further comprises:
  a first branch connected between a first reference voltage and a second voltage reference, said first branch comprising, in series, a first biasing resistor, a first diode, a collector-emitter circuit of a first bipolar transistor and a first current source; and
  a second branch connected between said first reference voltage (Vdd) and said second reference voltage, said second branch including, in series, a second biasing resistor, a second diode, a collector-emitter circuit of a second bipolar transistor and a second current source.

The first transistor has a base terminal which is coupled to the collector terminal of said second transistor and to the second input.

The second transistor has a base terminal which is coupled to the collector terminal of said first transistor and to the first input.

The active circuit of one embodiment further comprises
  a capacitor connected between the emitter terminal of said first bipolar transistor and the emitter terminal of said second bipolar transistor; and
  a linearization resistor which is coupled in parallel between the two emitter terminals of said first and said second bipolar transistors.

Alternatively in one embodiment, a negative capacity may be connected in series to the acoustic resonator in order to allow control of the series resonant frequency of the latter, and the adjustable capacitive element is coupled in parallel on the whole so as to allow control of the parallel frequency.

One embodiment of the invention is particularly useful for mobile telecommunications.

BRIEF DESCRIPTION OF THE SEVERAL VIEWS OF THE DRAWINGS

Other features of one or more non-limiting and non-exhaustive embodiments of the invention will best be understood by reference to the following detailed description when read in conjunction with the accompanying drawings:

FIGS. 1A, 1B and 1C respectively illustrate the electrical model of an example BAW type resonator, the example characteristics impedance curve of such component as well as the example formulas which allows the computation of the series resonance frequency and the parallel resonance frequency of the same resonator.

FIG. 9 illustrates the example equations representing the operations of the circuit of FIG. 7.

DETAILED DESCRIPTION

In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

There is now more particularly described an embodiment of a circuit comprising an integrated resonator in accordance with the present invention, which is well suited for the realization of a RF receiver usable for mobile telecommunications.

In mobile telecommunications, and particularly in the latest applications such as the Wide Code Division Multiplexing Access (WCDMA), one needs to perform a very effective filtering process in order to separate different channels being very close one another. It should be noticed, however, that this is only a non limiting example of the use of the new integrated acoustic component which is described below.

One embodiment of the invention achieves such filtering in a very effective manner, and without requiring the use of any inductor of the Tunable Resonator Component described in the above mentioned U.S. patent application Ser. No. 11/025,599.

Figure 3A:
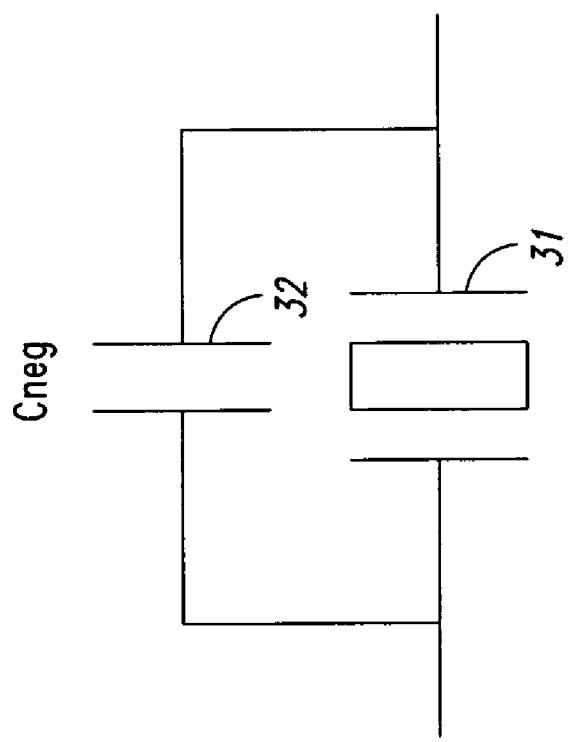
FIG. 3A illustrates a first embodiment of a resonance circuit in accordance with the present invention.

FIG. 3A illustrates a first embodiment showing a simplified resonance circuit which comprises, in parallel with a resonator BAW 31, a negative capacity Cneg 32.

Surprisingly, it has been noticed that one may obtain the same result than the one obtained with one inductor in the known circuit simply by using an active circuit which has the behavior of a negative capacity Cneg.

Figure 3B:
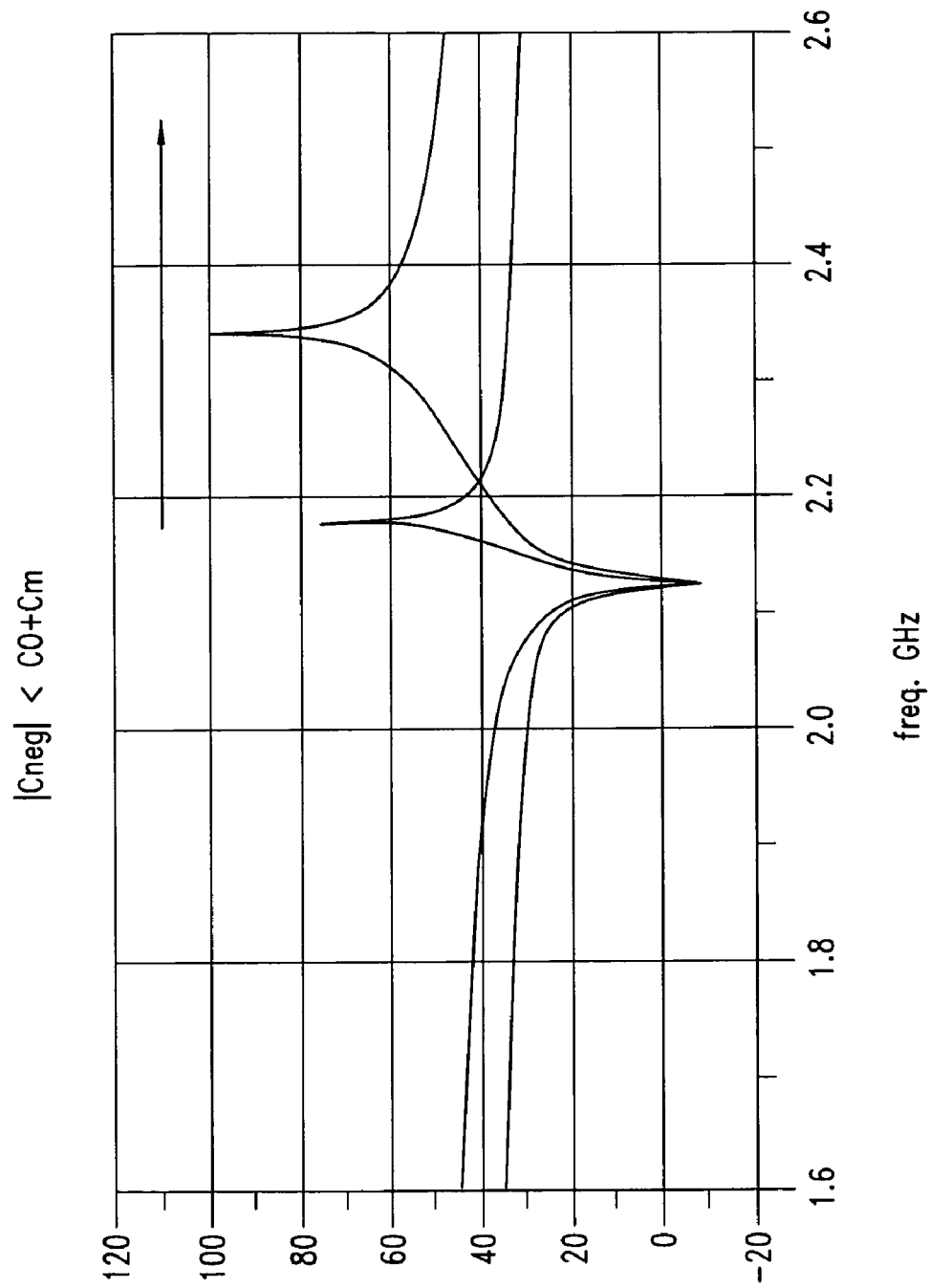
FIGS. 3B and 3C respectively illustrate the example effect produced by the negative capacity on the anti resonance frequency of the resonator in the first embodiment of FIG. 3A in accordance with the difference between the absolute value of Cneg and C0+Cm.
Figure 3C:
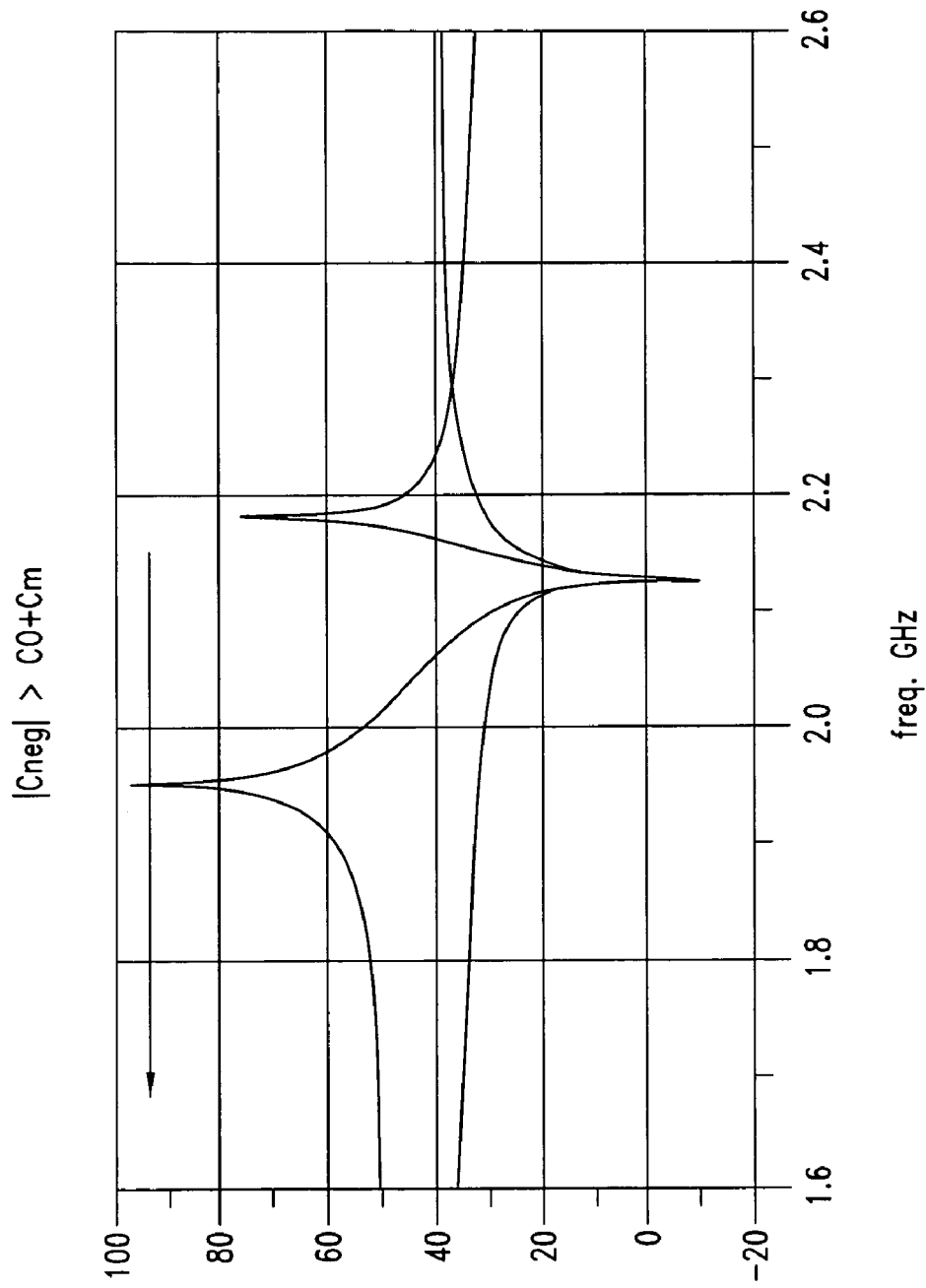

Simulations have shown indeed that, as a function of the absolute value of this negative capacity, one may cause the shifting, either to the right or to the left, of the anti-resonance frequency Fp while maintaining unchanged the series resonance frequency, as this is illustrated in FIGS. 3B and 3C.

More particularly, FIG. 3B shows that when the absolute value of Cneg is lower than the internal parameters C0+Cm of the BAW resonator, then the anti-resonance frequency is shifted to the right.

Conversely, when the absolute value of Cneg is higher than C0+Cm, the anti-resonance frequency is being shifted to the left as shown in FIG. 3C.

In addition, it has been noticed that there is no generation of any parasitic anti-resonance frequencies as this was known with the use of the inductor. This is a particularly advantageous effect from this embodiment.

Figure 4A:
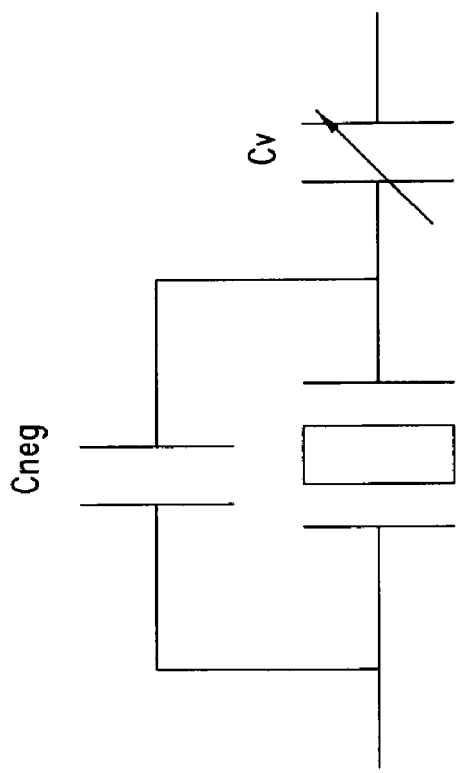
FIG. 4A illustrates a second embodiment.

FIG. 4A illustrates a second embodiment of a tunable resonator circuit which comprises, in series with the circuit of FIG. 3A, a tunable capacity component, such as a varactor for instance having a variable capacity Cv.

One thus obtains a circuit which provides numerous possibilities of tunings in accordance to the value of Cneg.

Figure 4B:
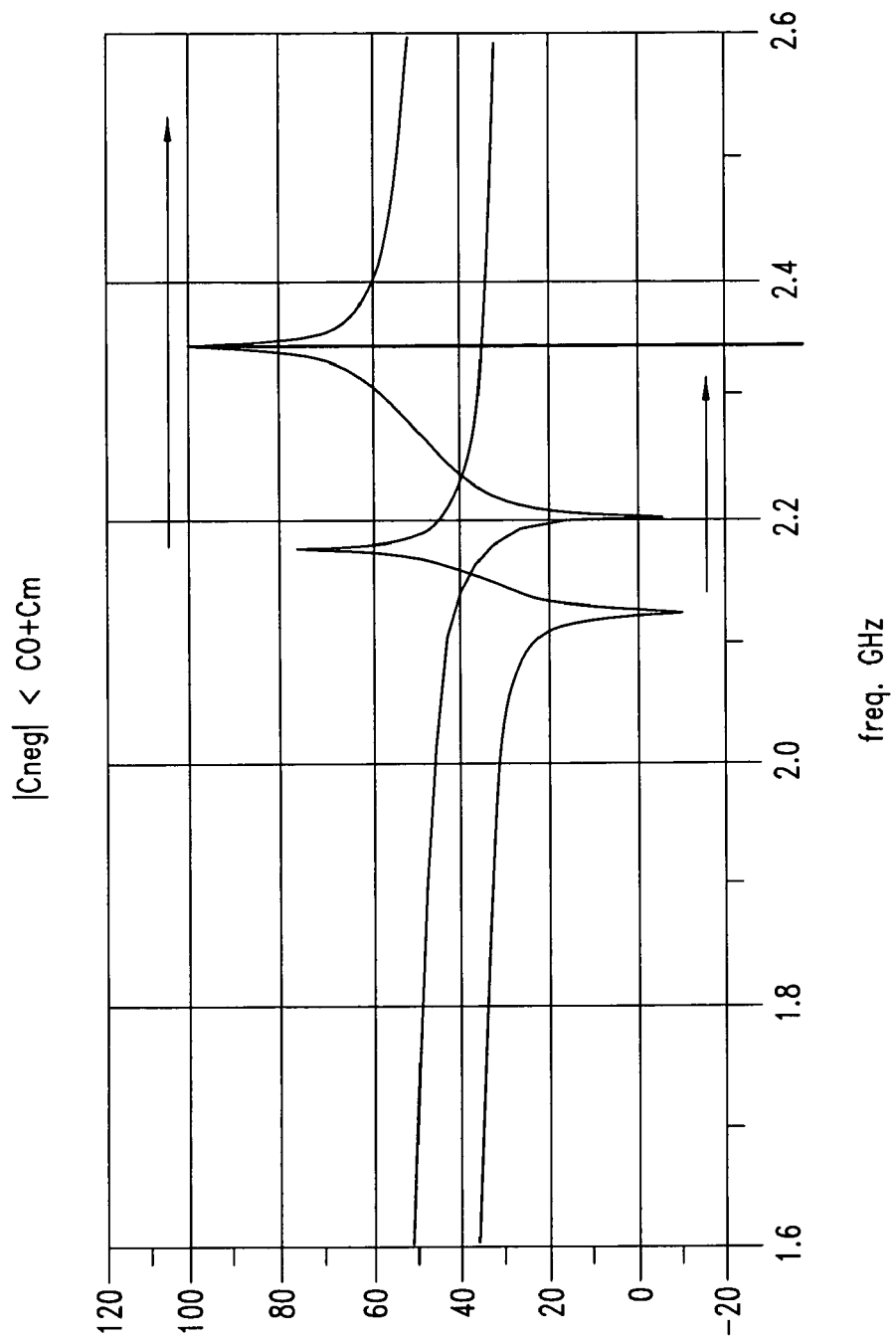
FIG. 4B to 4D respectively illustrate the example characteristics curves of the second embodiment in accordance to the value of the negative capacity Cneg with respect to the values of C0+Cm and C0+Cm+Cv.
Figure 4C:
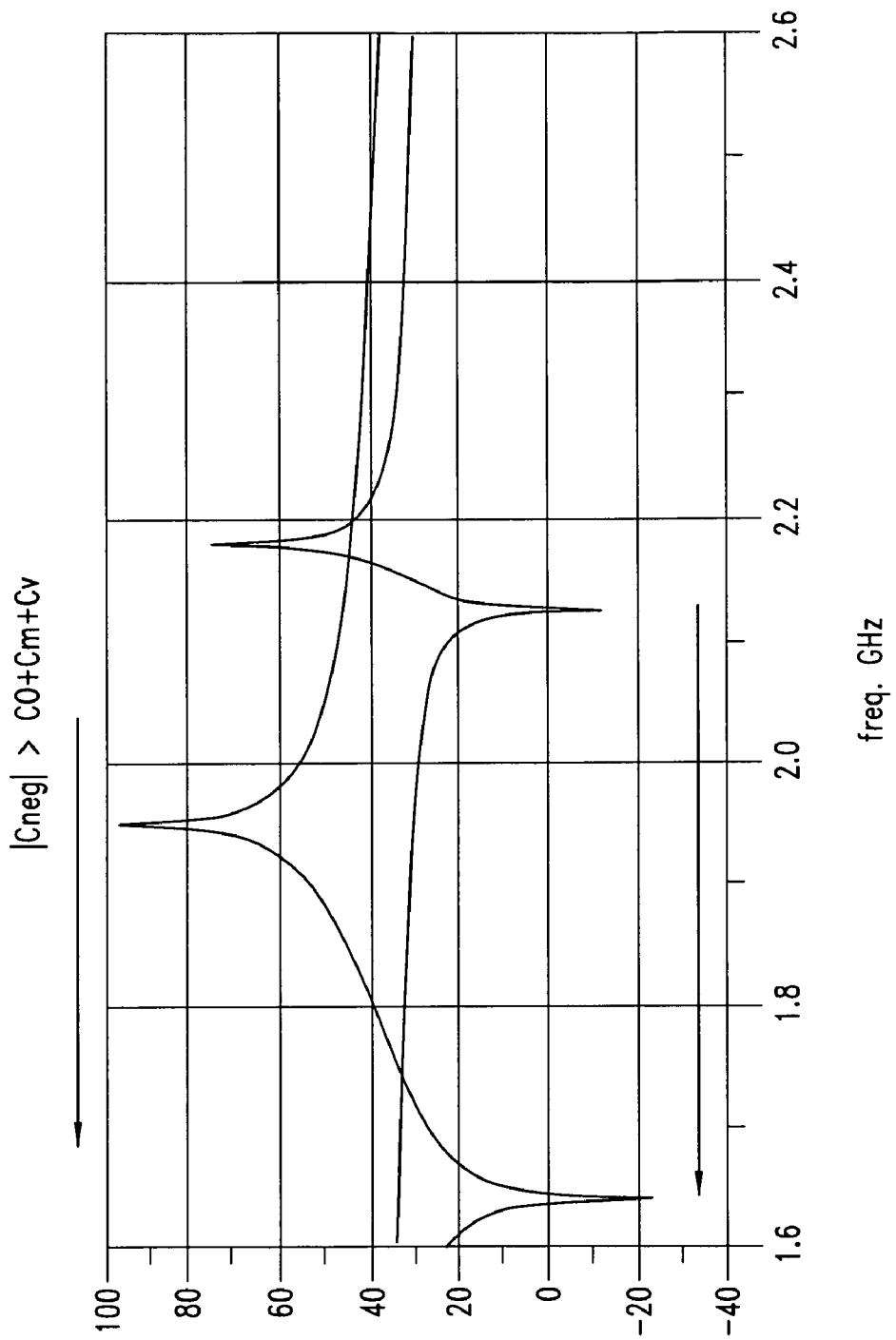
Figure 4D:
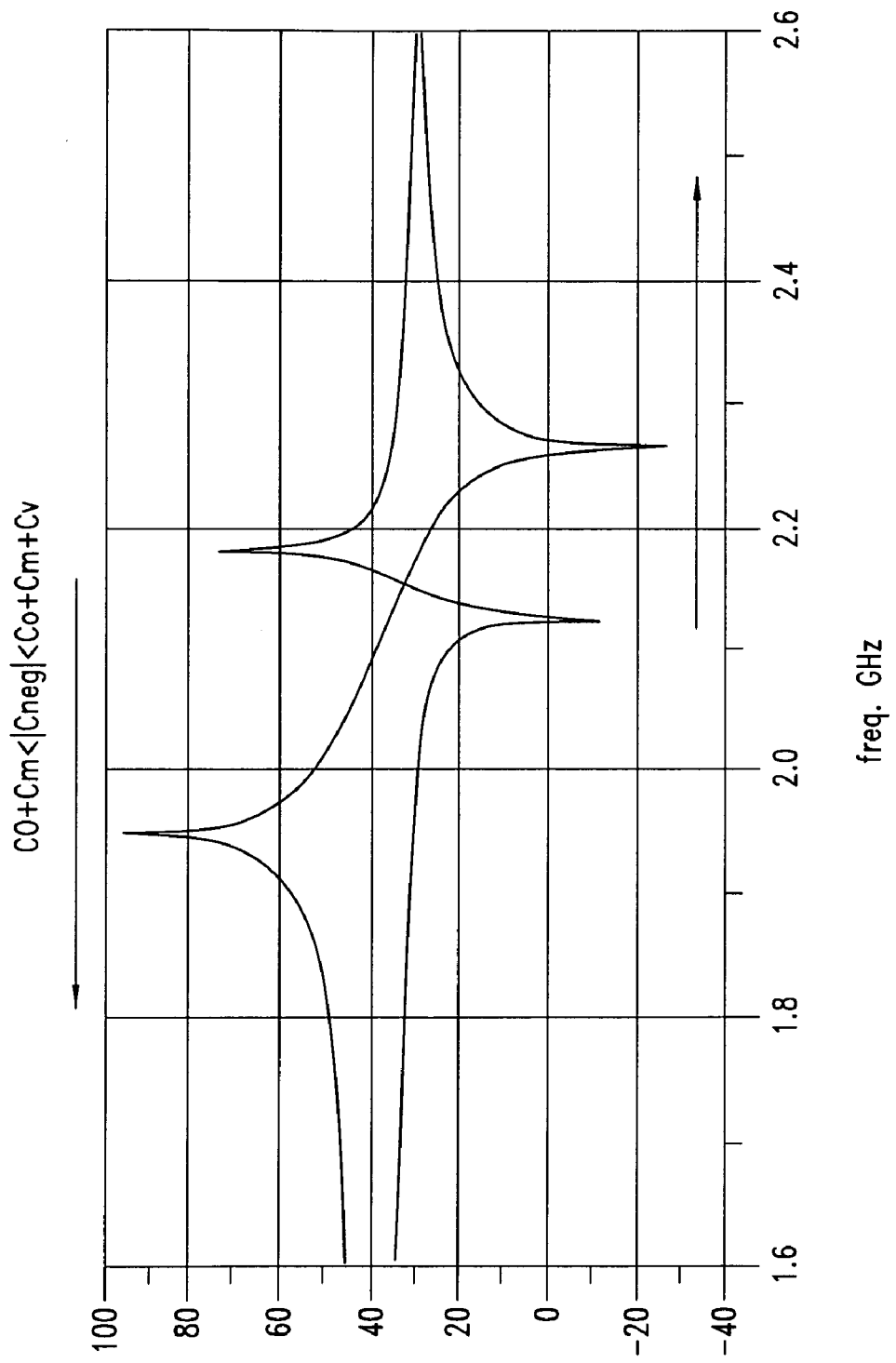

FIGS. 4B to 4D respectively illustrate the characteristics curves of the second embodiment in accordance with the negative capacity Cneg with respect to the values C0+Cm and C0+Cm+Cv.

When the absolute value of Cneg is lower than C0+Cm, then one notices the shifting to the right of the two series and parallel resonance frequencies, as this is illustrated in FIG. 4B.

When the absolute value of Cneg is higher than C0+Cm+Cv, the series resonance frequency Fs and the parallel resonance frequency Fp are both shifted to the left, as illustrated in FIG. 4C.

At last, when the absolute value of Cneg is comprised within C0+Cm and C0+CM+Cv, one notice that the series resonance frequency is shifted towards the right whereas the parallel resonance frequency is shifted towards the left, as shown in FIG. 4D.

As seen in FIGS. 4C-4D, in accordance with the particular values given to parameters Cneg and Cv, one may achieve a wide range of tuning possibilities for the embodiments of the resonance circuit of the invention.

Figure 5A:
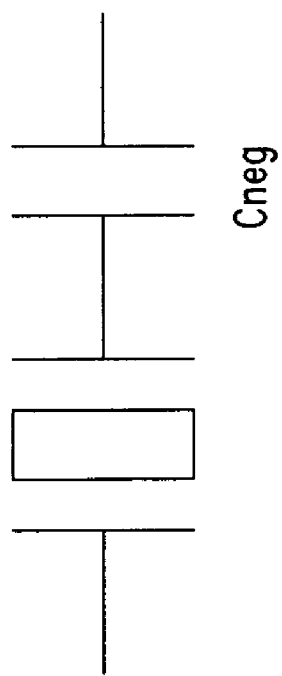
FIG. 5A illustrates a third embodiment.
Figure 5B:
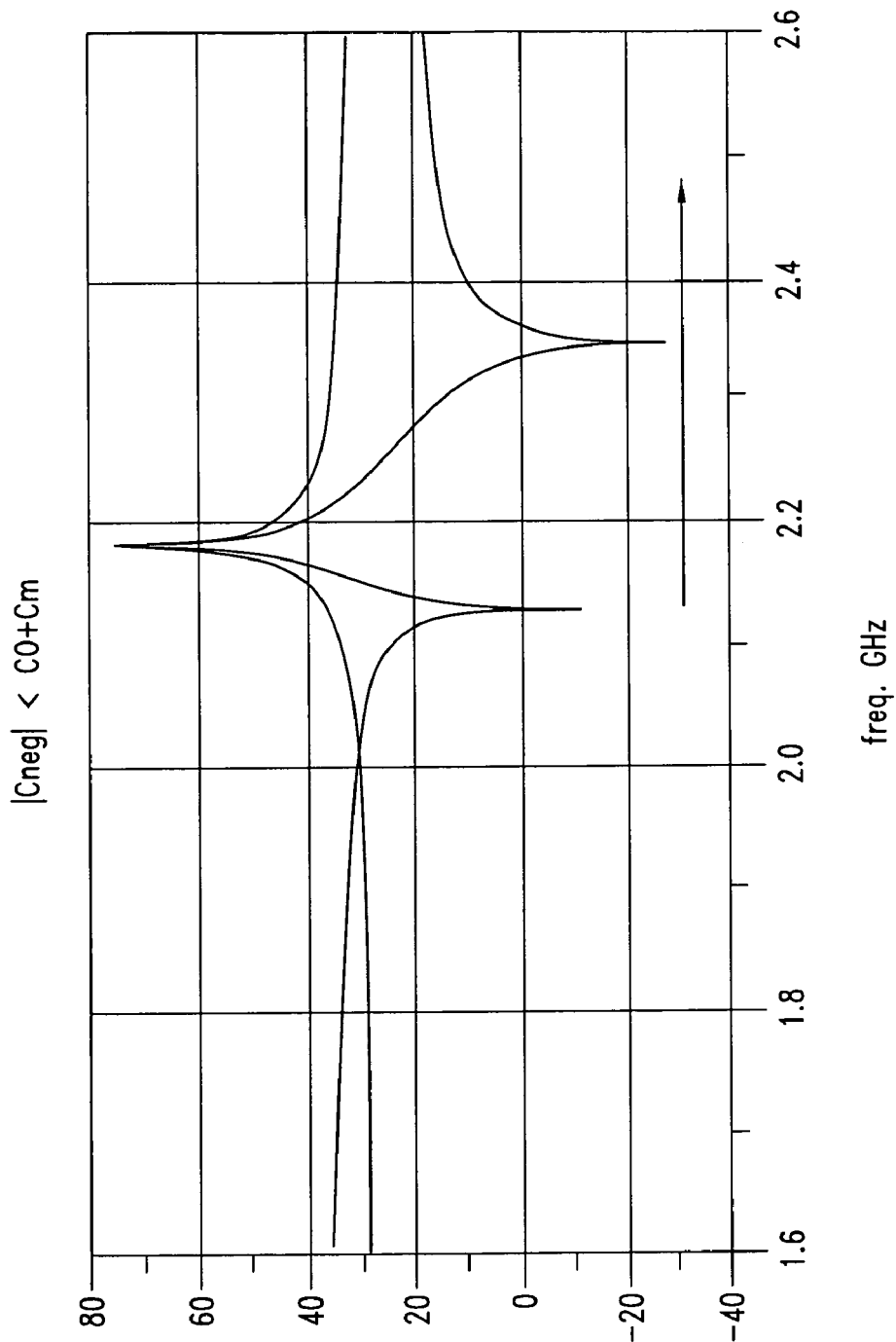
FIG. 5B to 5C respectively illustrate the example characteristics charts of the third embodiment in accordance to the value of the negative capacity Cneg with respect to the values C0+Cm and C0+Cm+Cv.
Figure 5C:
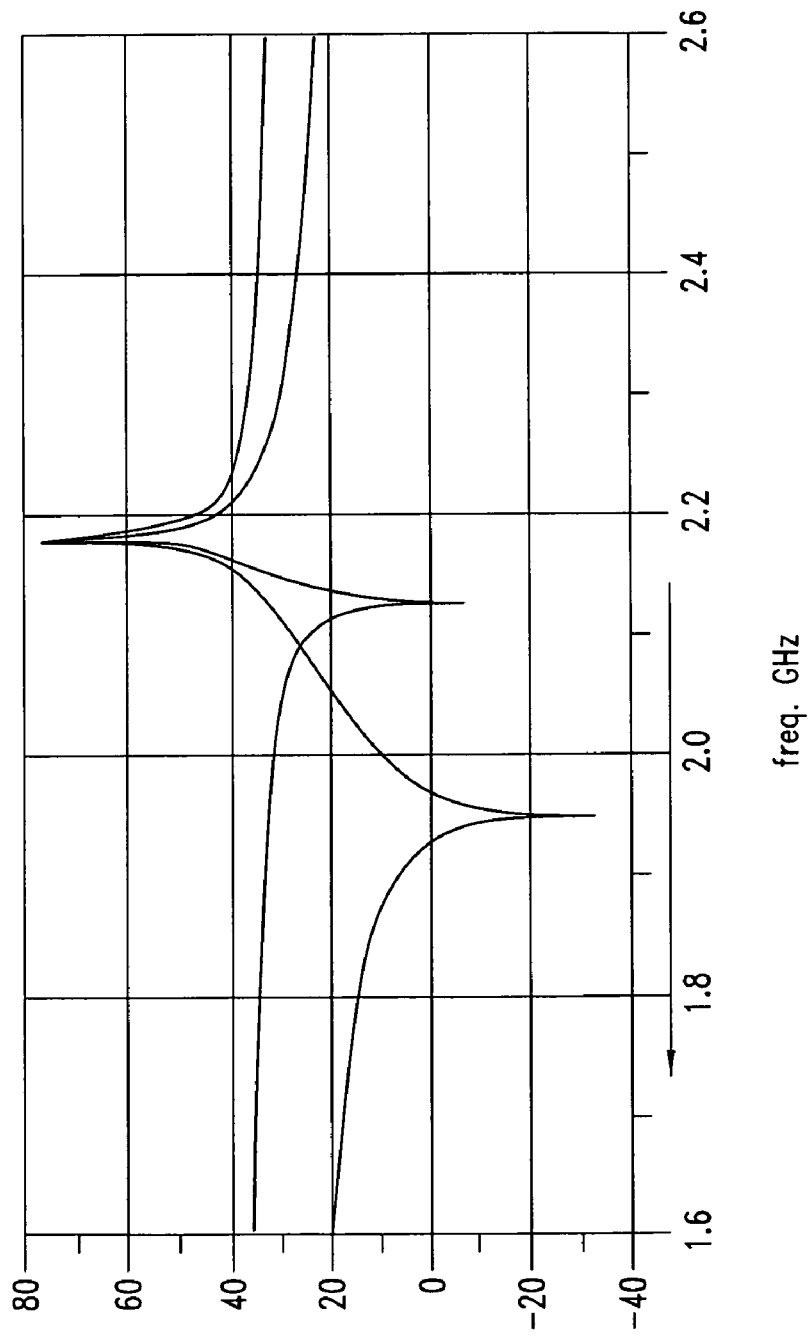

FIG. 5A illustrates a third embodiment which comprises a negative capacity Cv coupled in series with the BAW resonator. As this is seen in FIGS. 5B and 5C, one can shift, respectively to the rights or to the left, the series resonance frequency. Thus, when the absolute value of Cneg is lower than C0+Cm, the negative capacity causes the shifting to the right of the series resonance frequency, as this is illustrated in FIG. 5B. Conversely, when the absolute value of Cneg is higher than C0+Cm, one observes the shifting to the left of the series resonance frequency, as this is shown in FIG. 5C.

Figure 6A:
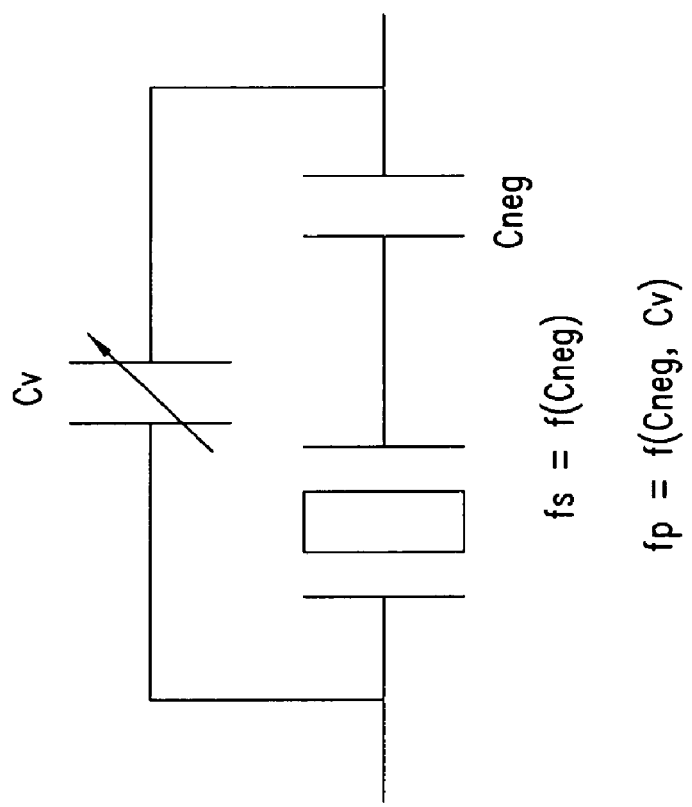
FIG. 6A illustrates a fourth embodiment of a resonance circuit of the present invention.

FIG. 6A illustrates a fourth embodiment comprising a BAW resonator which is connected in series with a negative capacity, and the whole being connected in parallel with a variable capacity element Cv.

Figure 6B:
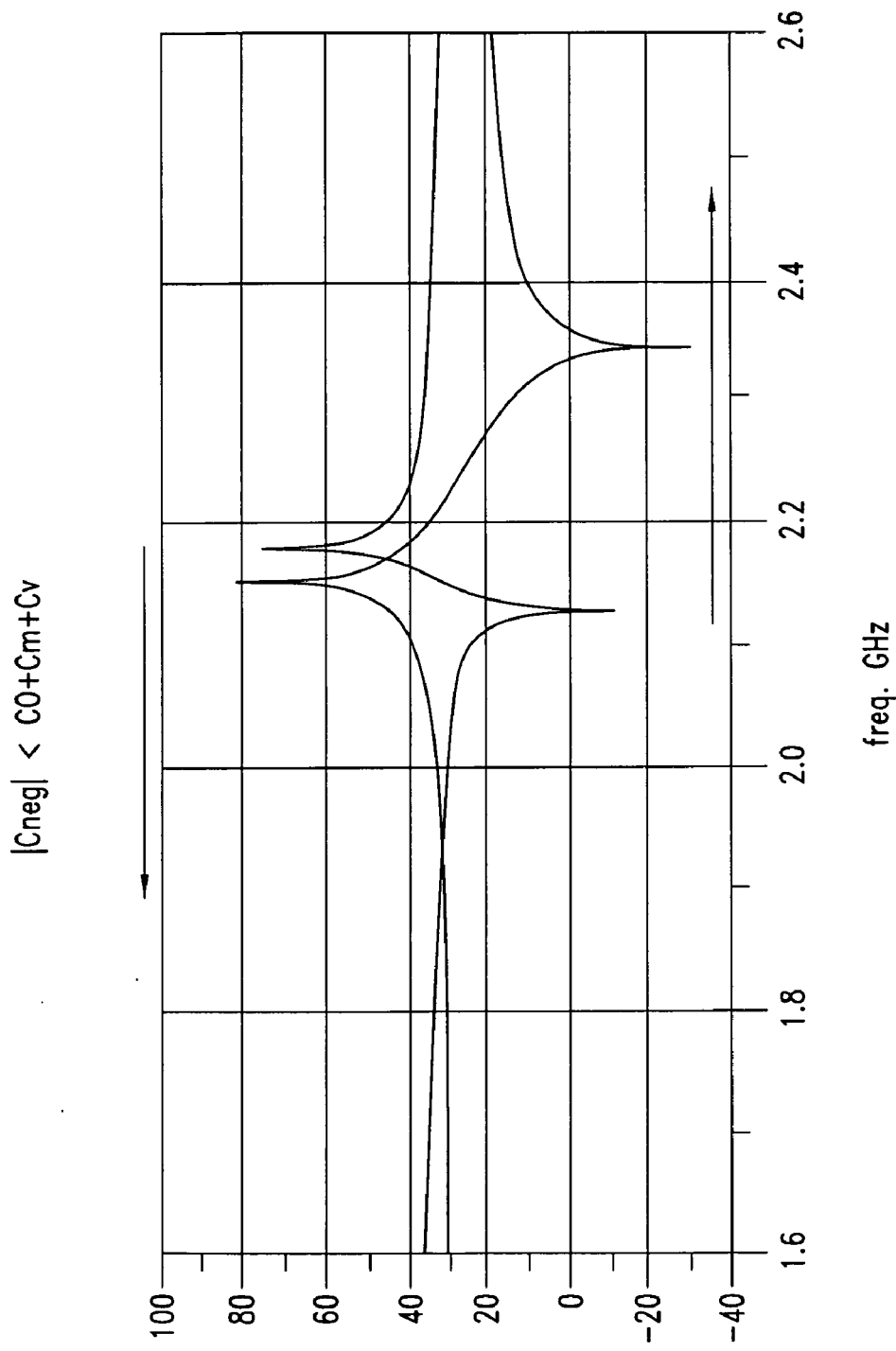
FIGS. 6B and 6C respectively illustrate the example characteristics curves of the fourth embodiment in accordance to the value of the negative capacity Cneg with respect to the value of C0+Cm+Cv.

FIG. 6B shows that, when the absolute value of Cneg is lower than C0+Cm+Cv, one causes the shifting to the right of the series resonance frequency and the shifting to the left of the parallel resonance frequency.

Figure 6C:
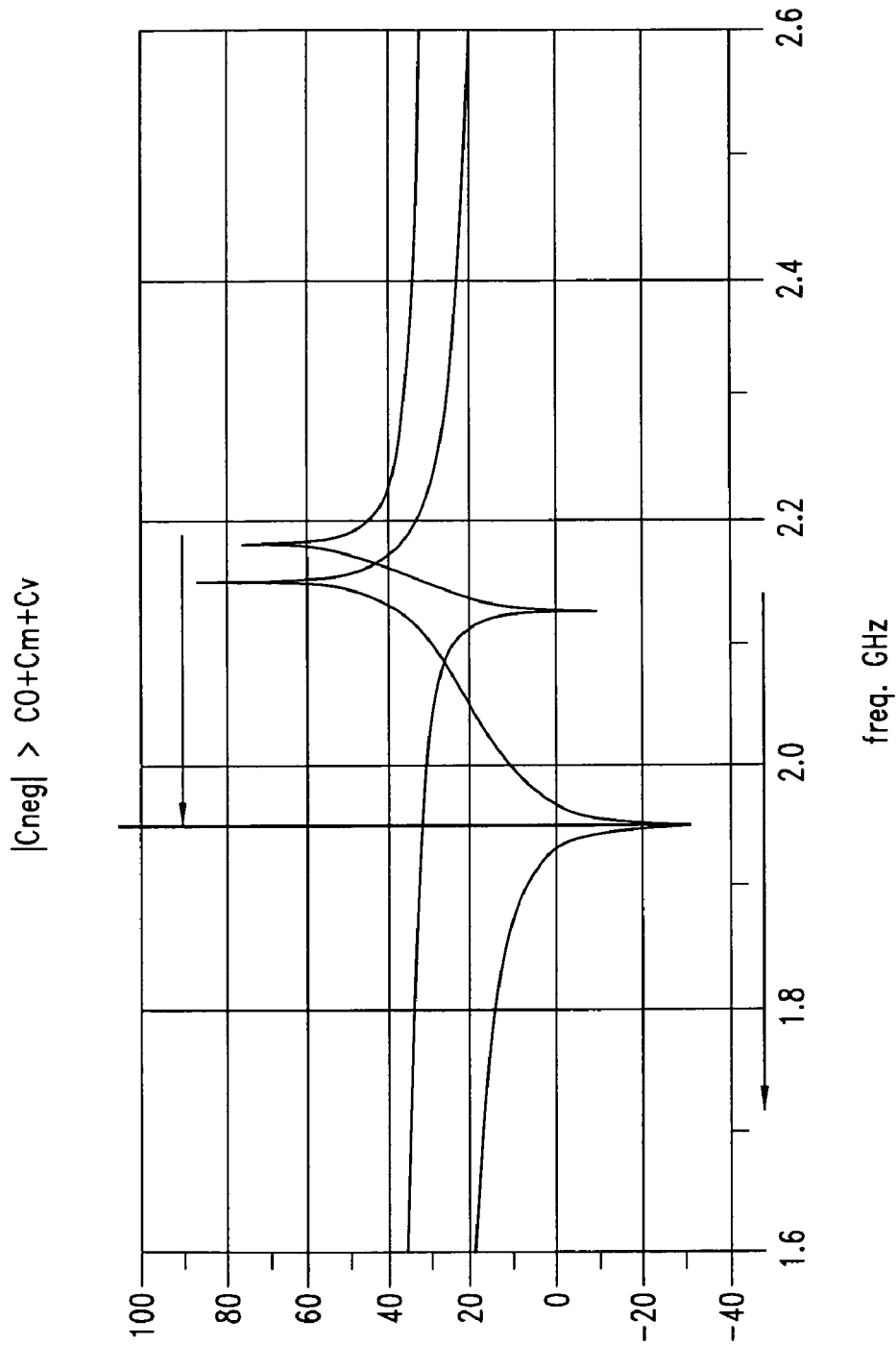

Conversely, as this can be seen in FIG. 6C, when the absolute value of Cneg is higher than C0+Cm+Cv, the two series and parallel resonance frequencies are shifted to the left.

Figure 7:
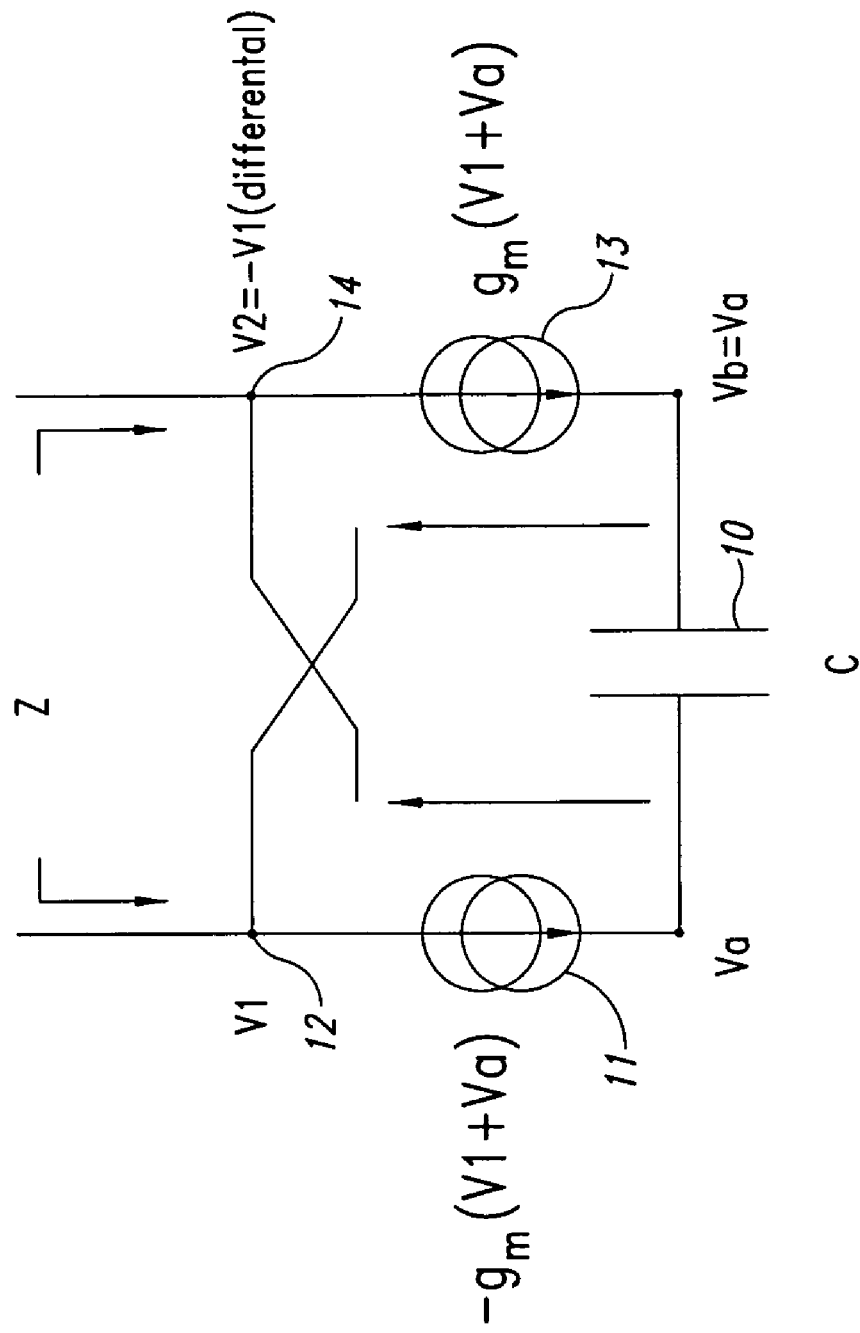
FIG. 7 illustrates the electrical model of a negative capacity complying with one embodiment of the present invention.

FIG. 7 illustrates one embodiment of a negative capacity, respectively between terminals 12 and 14, which comprises, in series, a first controlled current source 11, a capacitor 10 and a second controlled current source 13.

The voltage of terminals 12 and 14 are respectively designated as V1 and V2 (V2 being supposed to be equal to −V1 in a differential configuration). In addition, one designates Va the voltage of the terminal at the junction between the first source 11 and capacitor 10, and one designates Vb the voltage of the terminal at the junction of the second source 13 and capacitor 10.

The equations ruling the operation of the two controllable current sources 11 and 13 are as follows:

$I=gm(V2+Vb)=-gm(V1+Va)$ for the controlled current source 11, and $I=gm(V1+Va)$ for controlled current source 13.

The parameter gm is, by definition, the transconductance of the voltage controlled source of bipolar transistors 43 and 48 of the controllable current source.

Figure 8:
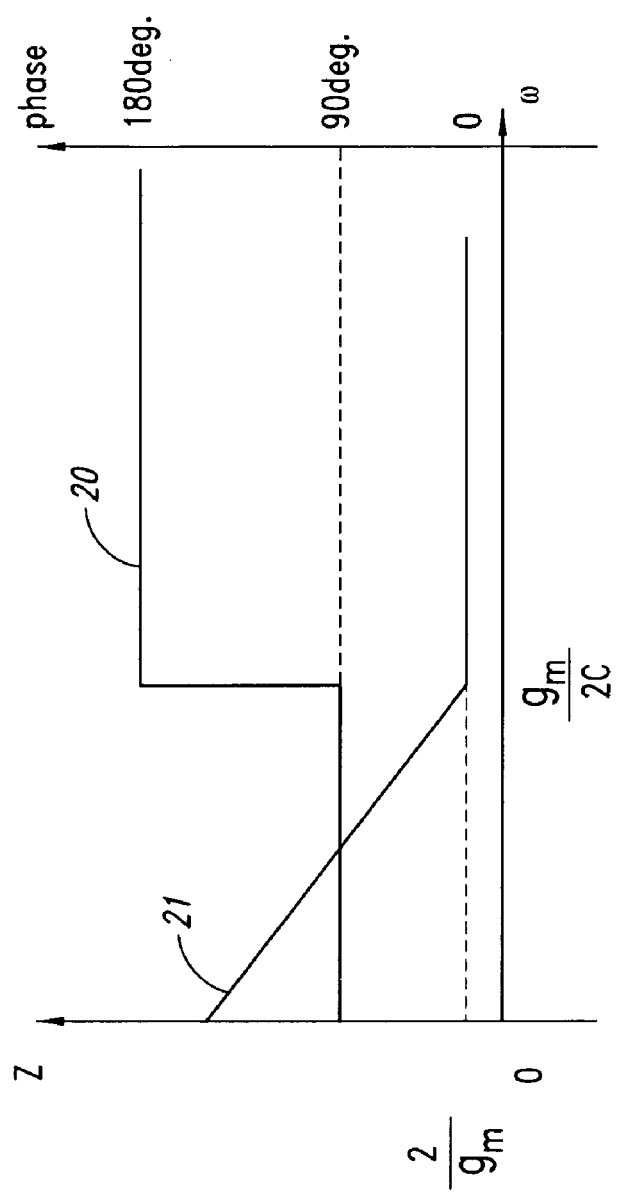
FIG. 8 illustrates the charts representing the example impedance curves of the negative capacity circuit combined with the BAW resonator.

When considering this electrical equivalent model, the equations of which being illustrated in FIG. 9 for the sake of clarity, one notices that it is possible to achieve impedance curves complying with the charts shown in FIG. 8. It can be seen that, the impedance curve 21 falls with a slope of −20 dB/decade until it reaches a critical pulsation value being equal to gm/2 C and, beyond that value, the circuit introduces a phase advance of 90 degrees on the phase curve 20.

Those curves clearly show the behavior of a resistive circuit having a negative capacity in the lower frequencies.

Figure 10:
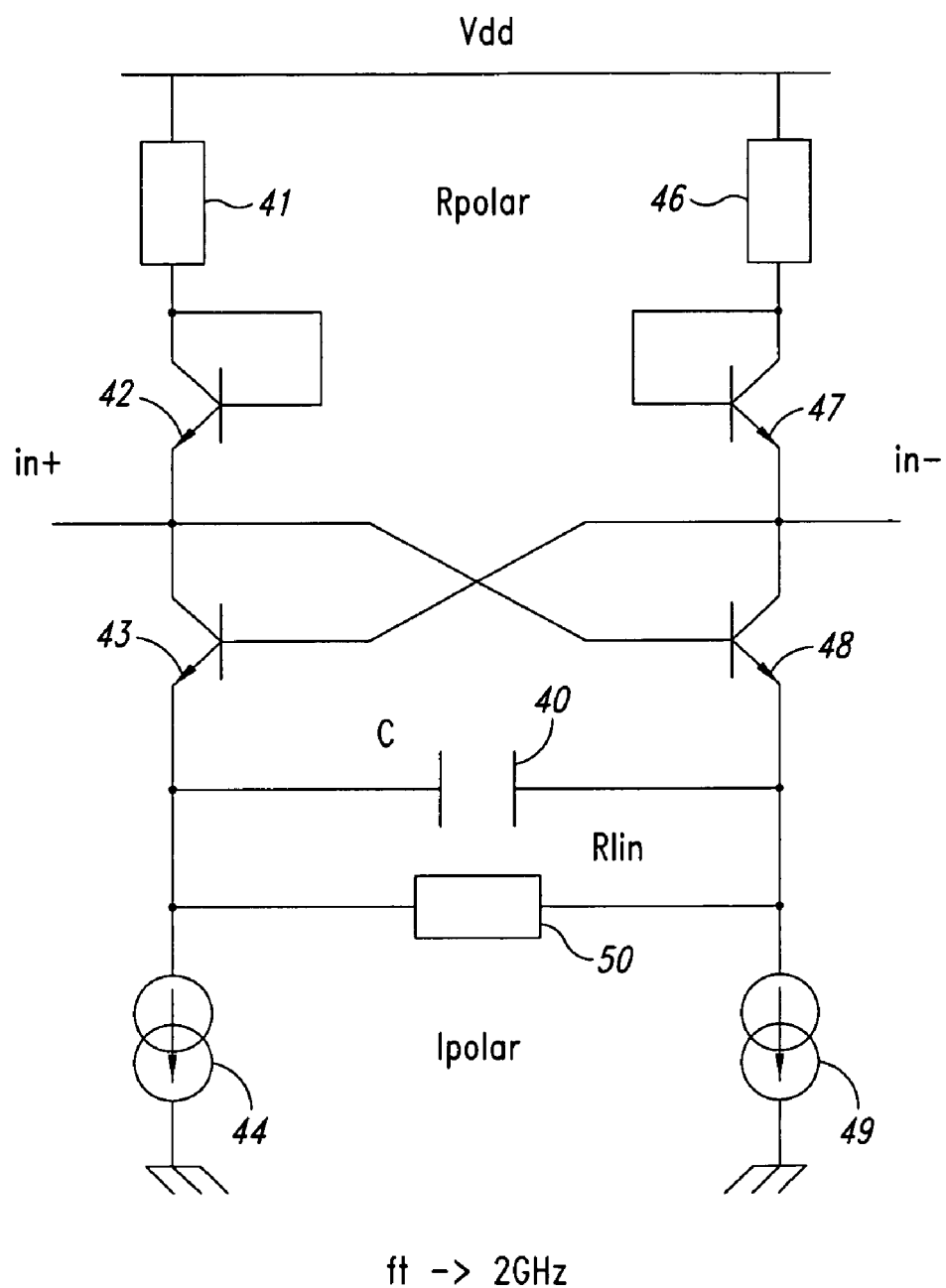
FIG. 10 illustrates one embodiment of a negative capacity circuit which can be used with a BAW resonator.

FIG. 10 illustrates one embodiment of a circuit in accordance with the present invention which is particular suitable for a RF filter operating at high frequencies, such as for mobile telecommunications.

This circuit comprises a first and a second branch, each being connected between a first reference voltage Vdd and a second reference voltage (Ground).

The first branch comprises, connected in series, a first bias resistor 41, a first diode 42, and then a collector-emitter circuit (the collector-base and base-emitter junctions connected in series) of a first bipolar transistor 43 and a first current source 44.

The second branch comprises, connected in series, a second bias resistor 46, a second diode 47, and then the collector-emitter circuit (i.e., the series of the collector-base and base-emitter junctions) of a second bipolar transistor 48 and then a second current source 49.

The base terminal of first transistor 43 is connected to the collector terminal of the second transistor 48 (corresponding to the input In−). Based on a differential configuration, the base terminal of the second transistor 48 is connected to the collector of the first transistor 43 (corresponding in addition to input In+).

At last, the circuit includes a capacitor 40 having a value C which is connected between the emitter of the first bipolar transistor 43 and the emitter of the second bipolar transistor 48. A linearization resistor Rlin 50 is also connected in parallel between the two emitter terminals of the first and second bipolar transistors.

On may take advantage of bipolar transistors for circuits 43 and 44 since such bipolar transistors provide a high value of transconductance.

Current sources 44 and 49 are bias current sources which respectively cooperate with bias resistors 41 and 46.

In one particular embodiment, diodes 42 and 47 are carried out using the base-emitter junction of the bipolar transistor.

In one particular embodiment, these current sources 44 and 49 are carried out using MOS type transistors. Alternatively, one can use bipolar type transistors.

It should be noticed that the circuit of FIG. 4 enters into oscillation if no voltage control is applied to the terminals of the collector of the first and second bipolar transistors 43 and 44, respectively corresponding to inputs In− and In+.

On the other hand, when one applies a control voltage on the two inputs terminals In+ and In− which are respectively coupled to the collectors of transistors 43 and 48, one can prevent the oscillation by default of the circuit. In that situation, it has been seen that one emulates the circuit which is illustrated in FIG. 1, and particularly adapted for high frequencies applications, such as beyond 2 Ghz. The linearization resistor 50 achieves the operation of the circuit for significant variations of the input voltages (of the order of 150 millivolts).

In one embodiment, the In+ and In− terminals of the negative capacitor circuit can be respectively coupled to the two terminals of the resonator, thereby providing a parallel configuration such as shown in FIGS. 3A and 4A. In the series configuration of FIGS. 5A and 6A, for example, a terminal of the resonator can be coupled to one of these input terminals of the negative capacitor circuit, while a terminal of the variable capacitor can be coupled to the other one of these input terminals off the negative capacitor circuit.

Figure 1A:
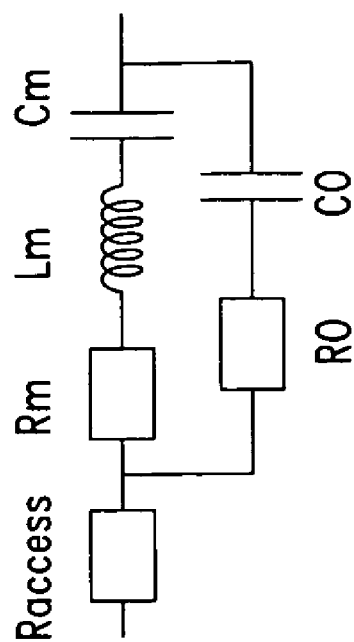
Figure 1A:
Figure 1A:
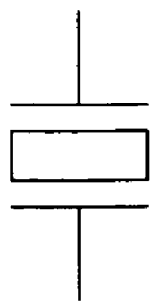
Figure 1B:
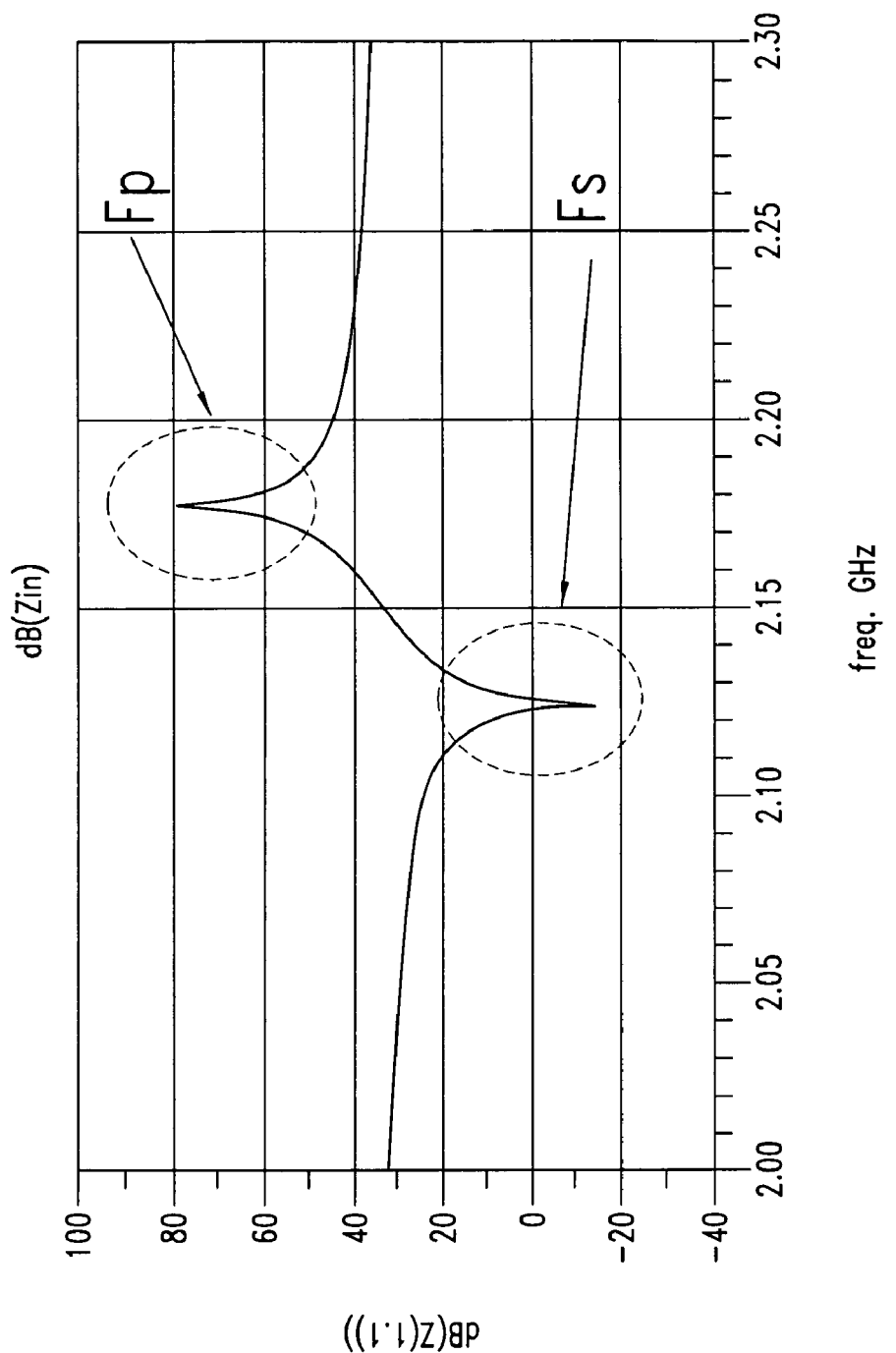
Figure 2A:
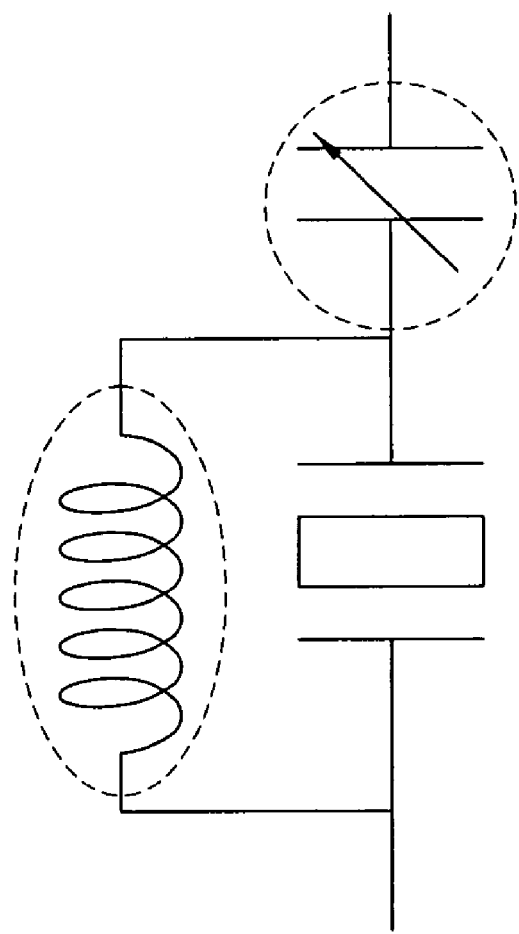
FIGS. 2A and 2B illustrate a known resonator circuit comprising a BAW resonator associated with an inductor and a variable capacitor.
Figure 2B:
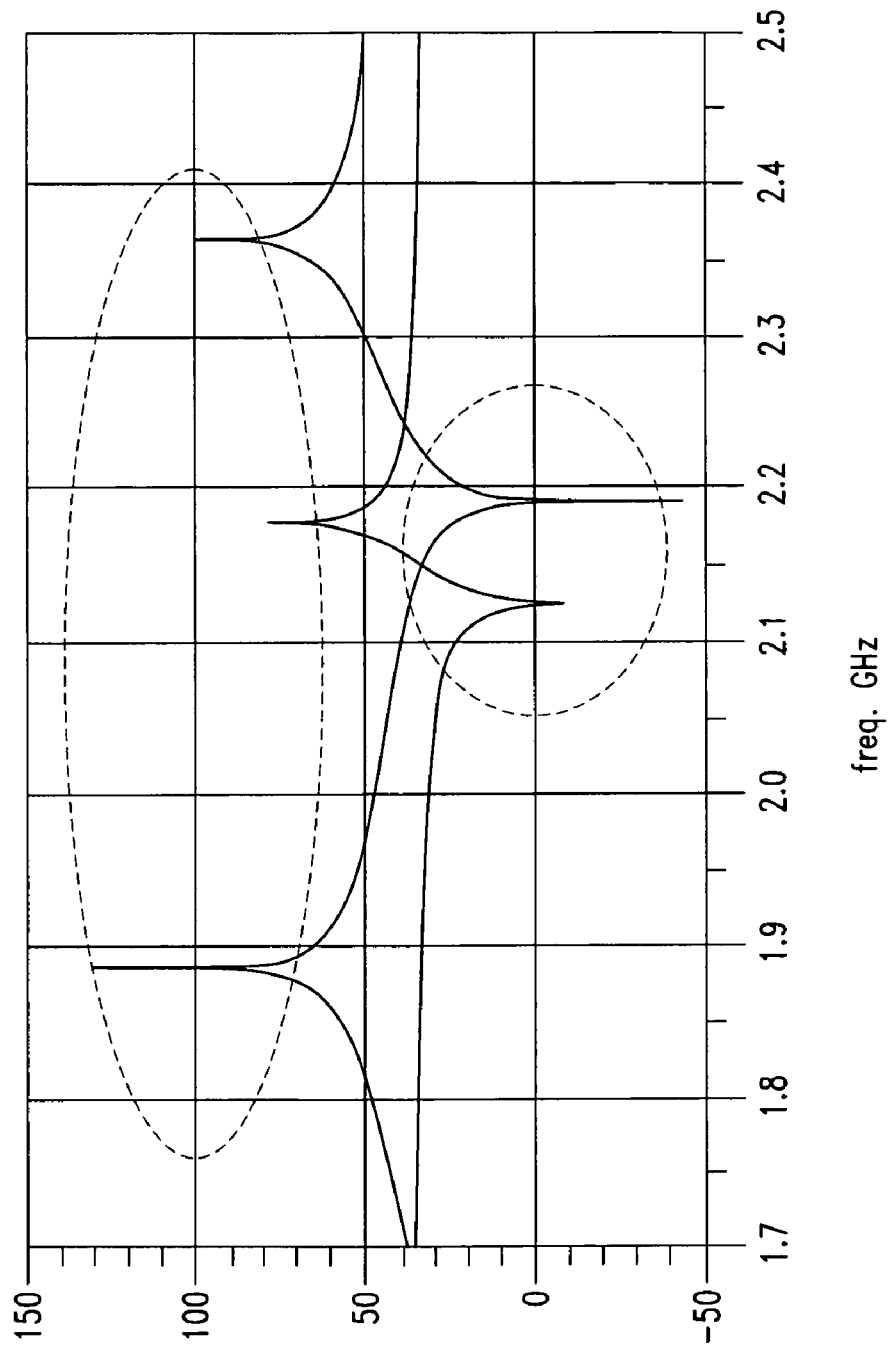
Figure 11:
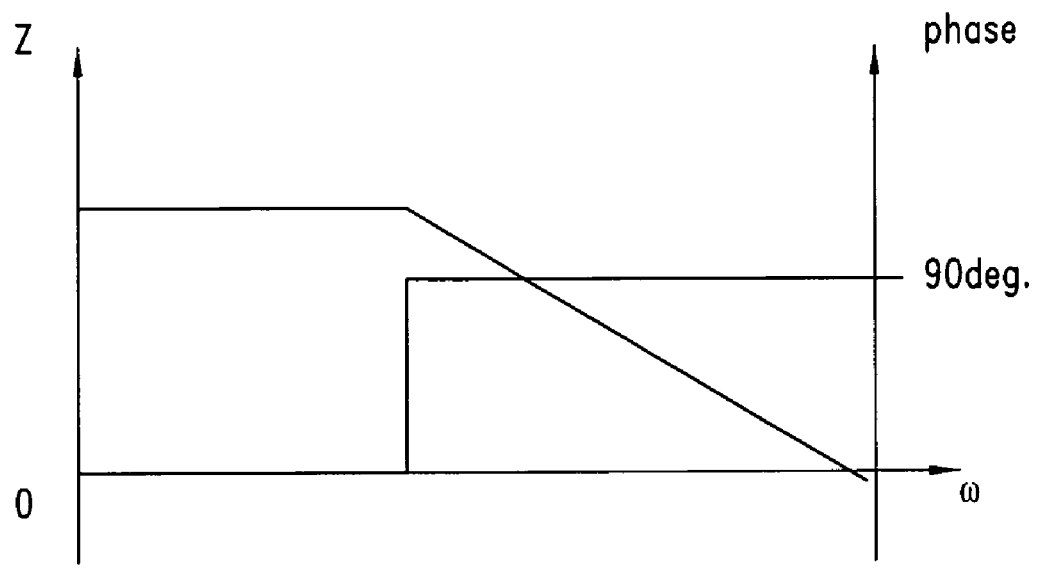
FIG. 11 illustrates the example curves representative of the circuit of FIG. 10.

FIG. 11 illustrates the charts which are representative of the example impedance (modulus and phase) of the circuit illustrated in FIG. 4. It can be seen that the curve of FIG. 2 has been slightly changed with the used of the linearization resistor 50 being connected in parallel with the capacitor 40 and the diodes connected transistors.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification, the Abstract, and the claims, but should be construed to include all possible embodiments along with the full scope of equivalents to which such claims are entitled. Accordingly, the claims are not limited by the disclosure.

What is claimed is:

1. An electronic circuit, comprising:
   an acoustic resonator of BAW or SAW type, said resonator having a series resonant frequency and a parallel resonant frequency; and
   an active circuit which is coupled in parallel to said acoustic resonator, said active circuit having a negative capacity to act on the parallel resonant frequency of said resonator, the active circuit comprising a first input terminal and a second input terminal and further comprising:
   a first branch coupled between a first reference voltage and a second voltage reference, said first branch having, in series, a first biasing resistor, a first diode, a collector-emitter circuit of a first bipolar transistor, and a first current source;
   a second branch coupled between said first reference voltage and said second reference voltage, said second branch having, in series, a second biasing resistor, a second diode, a collector-emitter circuit of a second bipolar transistor, and a second current source, said first transistor having a base terminal which is coupled to a collector terminal of said second transistor and to said second input terminal, and said second transistor having a base terminal which is coupled to a collector terminal of said first transistor and to said first input terminal;
   a capacitor coupled between an emitter terminal of said first bipolar transistor and an emitter terminal of said second bipolar transistor; and
   a linearization resistor which is coupled in parallel between the emitter terminals of said first and said second bipolar transistors.

2. The electronic circuit according to claim 1, further comprising coupled in series with said resonator and said active circuit, an adjustable capacitive element to control the series resonant frequency.

3. The electronic circuit according to claim 1 wherein said adjustable capacity element is a varactor controllable by a control voltage.

4. The electronic circuit according to claim 1 wherein said first and said second current sources are based on MOS type transistors.

5. The electronic circuit according to claim 1 wherein said first and said second diodes are emitter-collector junctions of bipolar transistors.

6. An electronic circuit, comprising:
   a BAW or SAW type acoustic resonator having a series resonant frequency and a parallel resonant frequency; and
   an active circuit coupled in series with said acoustic resonator, said active circuit having a negative capacity to enable action on the series resonant frequency of said resonator, the active circuit comprising a first input terminal and a second input terminal and further comprising:
   a first branch coupled between a first reference voltage and a second voltage reference, said first branch having, in series, a first biasing resistor, a first diode, a collector-emitter circuit of a first bipolar transistor, and a first current source;
   a second branch coupled between said first reference voltage and said second reference voltage, said second branch having, in series, a second biasing resistor, a second diode, a collector-emitter circuit of a second bipolar transistor, and a second current source, said first transistor having a base terminal which is coupled to a collector terminal of said second transistor and to said second input terminal, and said second transistor having a base terminal which is coupled to a collector terminal of said first transistor and to said first input terminal;
   a capacitor coupled between an emitter terminal of said first bipolar transistor and an emitter terminal of said second bipolar transistor; and a linearization resistor which is coupled in parallel between the emitter terminals of said first and said second bipolar transistors.

7. The electronic circuit according to claim 6, further comprising coupled in parallel to said resonator and said active circuit, an adjustable capacitive element to enable control of the parallel resonant frequency of said resonator.

8. The electronic circuit according to claim 7 wherein said adjustable capacitive element is a varactor controllable by a control voltage.

9. A mobile telecommunications device, comprising:
a SAW or a BAW type acoustic resonator, said resonator including a series resonant frequency and a parallel resonant frequency;
an active circuit coupled in parallel to said acoustic resonator to provide a negative capacity to enable control of the parallel resonant frequency of said resonator;
an adjustable capacitive element coupled in series to said parallel coupled active circuit and acoustic resonator to enable control of the series resonant frequency of said resonator;
said active circuit having a first terminal and a second input terminal, and further having:
a first branch coupled between a first reference voltage and a second voltage reference, said first branch having, in series, a first biasing resistor, a first diode, a collector-emitter circuit of a first bipolar transistor, and a first current source;
a second branch coupled between said first reference voltage and said second reference voltage, said second branch having, in series, a second biasing resistor, a second diode, a collector-emitter circuit of a second bipolar transistor, and a second current source, said first transistor having a base terminal which is coupled to a collector terminal of said second transistor and to said second input terminal, and said second transistor having a base terminal which is coupled to a collector terminal of said first transistor and to said first input terminal;
a capacitor coupled between an emitter terminal of said first bipolar transistor and an emitter terminal of said second bipolar transistor; and
a linearization resistor which is coupled in parallel between the emitter terminals of said first and said second bipolar transistors.

10. The device of claim 9 wherein said acoustic resonator has a first capacity and a second capacity, and wherein said capacitive element has a third capacity, wherein:
said parallel and series resonant frequencies are shifted upward if a value of said negative capacity is less than a sum of said first and second capacities;
said parallel and series resonant frequencies are shifted downward if said value of said negative capacity is greater than a sum of said first and second capacities and said third capacity; and
said parallel and series resonant frequencies are shifted in opposite directions if said value of said negative capacity is between: (a) said sum of said first and second capacities and (b) said sum of said first and second capacities and said third capacity.

11. The device of claim 10 wherein said acoustic resonator, active circuit, and adjustable capacitive element form part of a filter circuit of a receiver.

12. An apparatus, comprising:
an acoustic resonator having first and second resonant frequencies, the acoustic resonator further having first and second capacitances; and
an active circuit coupled to said acoustic resonator, said active circuit having an adjustable negative capacitance to act on at least one of said first and second resonant frequencies, the active circuit comprising:
first and second input terminals; a first branch having a first transistor, a resistor, a diode, and a first current source; a second branch having a second transistor, a resistor, a diode, and a second current source; wherein said first transistor is coupled to said second transistor and to said second input terminal, and wherein said second transistor is coupled to said first transistor and to said first input terminal;
a capacitor coupled between said first transistor and said second transistor; and a resistor coupled between said first transistor and said second transistor.

13. The apparatus of claim 12 wherein said active circuit is coupled in parallel to said acoustic resonator.

14. The apparatus of claim 13 wherein said second resonant frequency is shifted upward while said first resonant frequency is unshifted if a value of said negative capacitance is less than a sum of said first and second capacitances, and wherein said second resonant frequency is shifted downward while said first resonant frequency is unshifted if said value of said negative capacitance is greater than said sum of said first and second capacitances.

15. The apparatus of claim 13, further comprising a capacitive element coupled in series to said parallel coupled active circuit and acoustic resonator, said capacitive element having a third capacitance, wherein:
both said first and second resonant frequencies are shifted upward if a value of said negative capacitance is less than a sum of said first and second capacitances;
both said first and second resonant frequencies are shifted downward if said value of said negative capacitance is greater than a sum of said first and second capacitances and said third capacitance; and
said first and second resonant frequencies are shifted in opposite directions if said value of said negative capacitance is between: (a) said sum of said first and second capacitances and (b) said sum of said first and second capacitances and said third capacitance.

16. The apparatus of claim 12 wherein said active circuit is coupled in series to said acoustic resonator.

17. The apparatus of claim 16 wherein said first resonant frequency is shifted upward while said second resonant frequency is unshifted if a value of said negative capacitance is less than a sum of said first and second capacitances, and wherein said first resonant frequency is shifted downward while said second resonant frequency is unshifted if said value of said negative capacitance is greater than said sum of said first and second capacitances.

18. The apparatus of claim 16, further comprising a capacitive element coupled in parallel to said series coupled active circuit and acoustic resonator, said capacitive element having a third capacitance, wherein:
both said first and second resonant frequencies are shifted downward if a value of said negative capacitance is greater than a sum of said first and second capacitances and said third capacitance; and
said first and second resonant frequencies are shifted in opposite directions if said value of said negative capacitance is less than said sum of said first and second capacitances and said third capacitance.

19. The apparatus of claim 12 wherein said acoustic resonator is a bulk acoustic wave (BAW) type or surface acoustic wave (SAW) type acoustic resonator.

20. A method to tune a filter that includes an acoustic resonator having first and second capacitances, an active circuit having a negative capacitance, and a capacitive element having a third capacitance, the method comprising:
- adjusting said negative capacitance of said active circuit to shift at least one of two resonant frequencies of said acoustic resonator, based on a value of said negative capacitance relative to a sum of said first and second capacitances; and
- adjusting said negative capacitance of said active circuit to shift said two resonant frequencies of said acoustic resonator in opposite directions, based on said value of said negative capacitance relative to a sum of said first, second, and third capacitances.

21. The method of claim 20, further comprising adjusting a value of said third capacitance to cause said shiftings.

22. The method of claim 20 wherein said acoustic resonator is coupled in parallel to said active circuit, and wherein said capacitive element is coupled in series to said parallel coupled active circuit and acoustic resonator, wherein said adjusting said negative capacitance of said active circuit to shift at least one of two resonant frequencies includes:
- shifting both said first and second resonant frequencies upward if said value of said negative capacitance is less than said sum of said first and second capacitances, and shifting both said first and second resonant frequencies downward if said value of said negative capacitance is greater than said sum of said first, second, and third capacitances; and
- wherein said adjusting said negative capacitance of said active circuit to shift said two resonant frequencies of said acoustic resonator in opposite directions includes:
- shifting first and second resonant frequencies in opposite directions if said value of said negative capacitance is between: (a) said sum of said first and second capacitances and (b) said sum of said first, second, and third capacitances.

23. The method of claim 20 wherein said acoustic resonator is coupled in series to said active circuit, and wherein said capacitive element is coupled in parallel to said series coupled active circuit and acoustic resonator, wherein said adjusting said negative capacitance of said active circuit to shift at least one of two resonant frequencies includes:
- shifting both said first and second resonant frequencies downward if said value of said negative capacitance is greater than said sum of said first, second, and third capacitances; and
- wherein said adjusting said negative capacitance of said active circuit to shift said two resonant frequencies of said acoustic resonator in opposite directions includes:
- shifting said first and second resonant frequencies in opposite directions if said value of said negative capacitance is less than said sum of said first, second, and third capacitances.

24. A circuit, comprising:
a filter having an acoustic resonator that comprises first and second capacitances, the filter further including an active circuit with a negative capacitance, and the filter also including a third capacitance, the negative capacitance structured to be adjustable to shift at least two resonant frequencies of the acoustic resonator based on a value of the negative capacitance relative to a sum of the first and second capacitances, and the negative capacitance further structured to be adjusted to shift the two resonant frequencies of the acoustic resonator in opposite directions based on a value of the negative capacitance relative to a sum of the first, second, and third capacitances.

25. The circuit of claim 24 wherein the third capacitance is adjustable to cooperate with the filter to shift the at least two resonant frequencies.

26. The circuit of claim 24 wherein the acoustic resonator is coupled in parallel to the active circuit, and wherein the third capacitance is coupled in series to the parallel coupled active circuit and acoustic resonator, and the negative capacitance is adjustable to shift both of the first and second resonant frequencies upward if the value of the negative capacitance is less than the sum of the first and second capacitances, and to shift both the first and second resonant frequencies downward if the value of the negative capacitance is greater than the sum of the first, second, and third capacitances; and
the negative capacitance further structured to be adjustable to adjust the two resonant frequencies of the acoustic resonator in opposite directions when the value of the negative capacitance is between: (a) the sum of the first and second capacitances and (b) the sum of the first, second, and third capacitances.

27. The circuit of claim 24 wherein the acoustic resonator is coupled in series to the active circuit, and the third capacitance is coupled in parallel to the series coupled active circuit and acoustic resonator, and the negative capacitance is structured to adjust the active circuit to shift both the first and second resonant frequencies downward when the value of the negative capacitance is greater than the sum of the first, second, and third capacitances, and to shift the two resonant frequencies of the acoustic resonator in opposite directions when the value of the negative capacitance is less than the sum of the first, second, and third capacitances.

* * * * *